(12) United States Patent
Stoddard et al.

(10) Patent No.: US 11,274,379 B2
(45) Date of Patent: Mar. 15, 2022

(54) SYSTEM FOR GROWING CRYSTAL SHEETS

(71) Applicant: II-VI Delaware, Inc., Wilmington, DE (US)

(72) Inventors: Nathan Stoddard, Chalfont, PA (US); Melissa Seitz, Hemet, CA (US)

(73) Assignee: II-VI DELAWARE, INC., Wilmington, DE (US)

(*) Notice: Subject to any disclaimer, the term of this patent is extended or adjusted under 35 U.S.C. 154(b) by 73 days.

(21) Appl. No.: 16/801,204

(22) Filed: Feb. 26, 2020

(65) Prior Publication Data

US 2021/0262120 A1    Aug. 26, 2021

(51) Int. Cl.
  *C30B 15/34*    (2006.01)
  *C30B 35/00*    (2006.01)

(52) U.S. Cl.
  CPC .......... *C30B 35/007* (2013.01); *C30B 15/34* (2013.01); *C30B 35/002* (2013.01)

(58) Field of Classification Search
  CPC ............ Y10T 117/1036; C30B 35/002; C30B 35/007
  See application file for complete search history.

(56) References Cited

U.S. PATENT DOCUMENTS

| | | | | |
|---|---|---|---|---|
| 3,801,309 A | * | 4/1974 | Mlavsky | C30B 21/06 75/10.11 |
| 4,334,948 A | * | 6/1982 | Berkman | C30B 15/34 117/26 |
| 4,353,757 A | * | 10/1982 | Kalejs | C30B 15/34 117/211 |
| 4,944,925 A | * | 7/1990 | Yamauchi | C30B 15/00 117/209 |
| 5,102,494 A | * | 4/1992 | Harvey | C30B 15/34 117/210 |
| 5,268,061 A | * | 12/1993 | Sunwoo | C30B 15/00 117/23 |
| 5,731,124 A | * | 3/1998 | Jonckheere | B41N 3/034 101/459 |

* cited by examiner

*Primary Examiner* — Robert M Kunemund
(74) *Attorney, Agent, or Firm* — Blank Rome LLP

(57) ABSTRACT

A die for growing a single crystal by an Edge-defined Film-fed Growth (EFG) technique includes a first outer die plate; a second outer die plate; and at least one central die plate positioned between the first outer die plate and the second outer die plate such that at least two capillaries are formed between the first outer die plate and the second outer die plate. First ends of the first outer die plate and the second outer die plate have a slope extending away from at least one of the at least two capillaries to form a growth interface at a top of the die. Second ends of the first outer die plate and the second outer die plate are immersed in a raw material melt provided in a crucible. The raw material melt is configured to travel to the growth interface by capillary flow of the raw material melt through the at least two capillaries.

22 Claims, 5 Drawing Sheets

SYSTEM FOR GROWING CRYSTAL SHEETS

BACKGROUND OF THE DISCLOSURE

Field

The present disclosure generally relates to systems and methods for growing crystals from a melt and, more particularly, to systems and methods for growing crystals having increased thickness.

Description of Related Art

Single crystal sapphire is the material of choice for optical applications involving high temperature, shock loading, and abrasion due to its optical properties, high strength, and abrasion and thermal shock resistance. Various methods have been developed for growing single crystal sapphire including the heat exchanger method, Edge-defined Film-fed Growth (EFG) techniques, and Czochralski (Cz) techniques.

Typical furnaces use with the EFG technique and involve the use of a capillary channel set inside of a die for the supply of liquid to the crystal growth area. Liquid is supplied to the top of the die from a crucible where a large repository of liquid melt is kept. The kinetics of the supply involve the capillary flow of liquid from the reservoir through the thin gap (<1 mm, i.e., a capillary channel) between two plates. A smaller gap equates to a greater capillary force to overcome the pull of gravity, but also limits the cross-section through which the liquid can move. If the process tries to grow at higher material throughput rates than those allowed by the capillary, then the crystal shrinks from the edges of the die and becomes thinner through the cross-section as well. Accordingly, a need exists for a crystal growth system that is configured to supply more liquid melt to the die surface in order to grow thicker crystal sheets.

SUMMARY OF THE DISCLOSURE

According to an aspect of the present disclosure, provided is a die for growing a single crystal by an Edge-defined Film-fed Growth (EFG) technique. The die comprises: a first outer die plate having a generally rectangular shape; a second outer die plate having a generally rectangular shape; and at least one central die plate positioned between the first outer die plate and the second outer die plate such that at least two capillaries are formed between the first outer die plate and the second outer die plate. First ends of the first outer die plate and the second outer die plate have a slope extending away from at least one of the at least two capillaries to form a growth interface at a top of the die. Second ends of the first outer die plate and the second outer die plate are immersed in a raw material melt provided in a crucible. The raw material melt is configured to travel to the growth interface by capillary flow of the raw material melt through the at least two capillaries.

According to another aspect of the present disclosure, provided is an apparatus for growing a crystal. The apparatus comprises: a crucible configured to contain a liquid melt; and a die located above the growth crucible. The die comprises a first outer die plate having a generally rectangular shape; a second outer die plate having a generally rectangular shape; and at least one central die plate positioned between the first outer die plate and the second outer die plate such that at least two capillaries are formed between the first outer die plate and the second outer die plate. First ends of the first outer die plate and the second outer die plate have a slope extending away from at least one of the at least two capillaries to form a growth interface at a top of the die. Second ends of the first outer die plate and the second outer die plate are immersed in a raw material melt provided in a crucible. The raw material melt is configured to travel to the growth interface by capillary flow of the raw material melt through the at least two capillaries.

These and other features and characteristics of the apparatus of the present disclosure, as well as the methods of operation and functions of the related elements of structures and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the device of the present disclosure. As used in the specification and the claims, the singular form of "a", "an", and "the" include plural referents unless the context clearly dictates otherwise.

DESCRIPTION OF THE DISCLOSURE

Figure 1A:
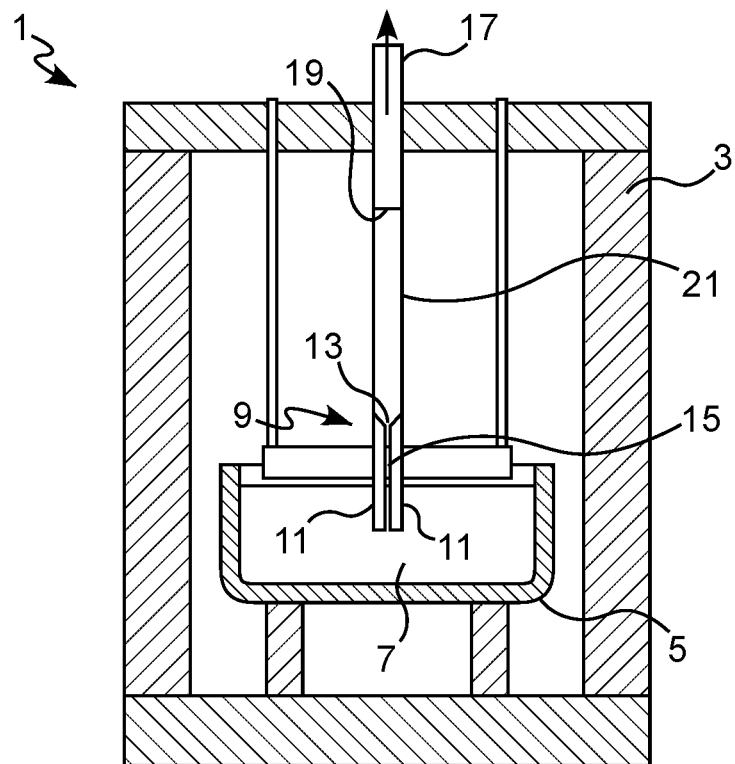
FIGS. 1A and 1B are schematic cross-sectional views of a system for growing crystal sheets.

For purposes of the description hereinafter, the terms "upper", "lower", "right", "left", "vertical", "horizontal", "top", "bottom", "lateral", "longitudinal", and derivatives thereof shall relate to the invention as it is oriented in the drawing figures. However, it is to be understood that the invention may assume alternative variations and step sequences, except where expressly specified to the contrary. It is also to be understood that the specific devices and processes illustrated in the attached drawings, and described in the following specification, are simply exemplary embodiments of the invention. Hence, specific dimensions and other physical characteristics related to the embodiments disclosed herein are not to be considered as limiting.

Unless otherwise indicated, all ranges or ratios disclosed herein are to be understood to encompass any and all subranges or subratios subsumed therein. For example, a stated range or ratio of "1 to 10" should be considered to include any and all subranges between (and inclusive of) the minimum value of 1 and the maximum value of 10; that is, all subranges or subratios beginning with a minimum value of 1 or more and ending with a maximum value of 10 or less, such as but not limited to, 1 to 6.1, 3.5 to 7.8, and 5.5 to 10.

Figure 1B:
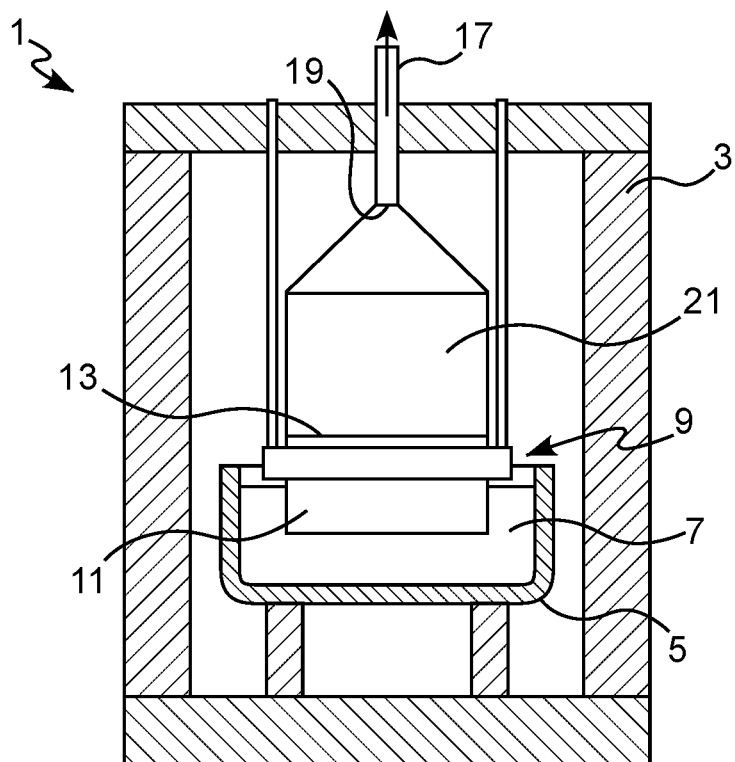

With reference to FIGS. 1A and 1B, a system growing a crystal, generally denoted as reference numeral 1, comprises a chamber 3 comprised of an insulation housing surrounding a crucible 5 configured to contain a liquid melt 7 of material to be crystalized, such as $Al_2O_3$ powder. A die 9 is positioned within the crucible 5. In FIG. 1A the die 9 is extending into the page and in FIG. 1B the die is extending across the page. While FIGS. 1A and 1B illustrate that one die 9 may be positioned within the crucible 5, this is not to be construed as limiting the present disclosure as any suitable number of dies 9 may be utilized. Die 9, as shown in FIGS. 1A and 1B, includes a pair of die plates 11 having a die opening 13 and one or more capillaries 15 extending from within the crucible 5 toward the die opening 13. A seed crystal moving mechanism 17 is also provided in the chamber 3 to move the seed crystal(s) 19 away from the die 9 as the crystal 21 is forming.

Figure 2A:
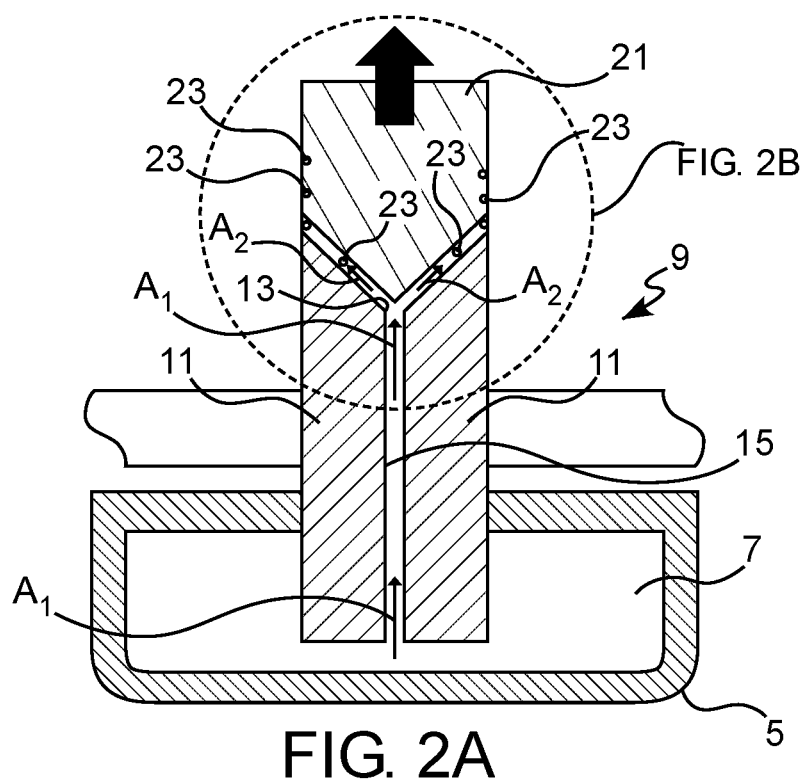
FIG. 2A is a schematic cross-sectional view of a system for growing crystal sheets illustrating a conventional die with a crystal being grown.
Figure 2B:
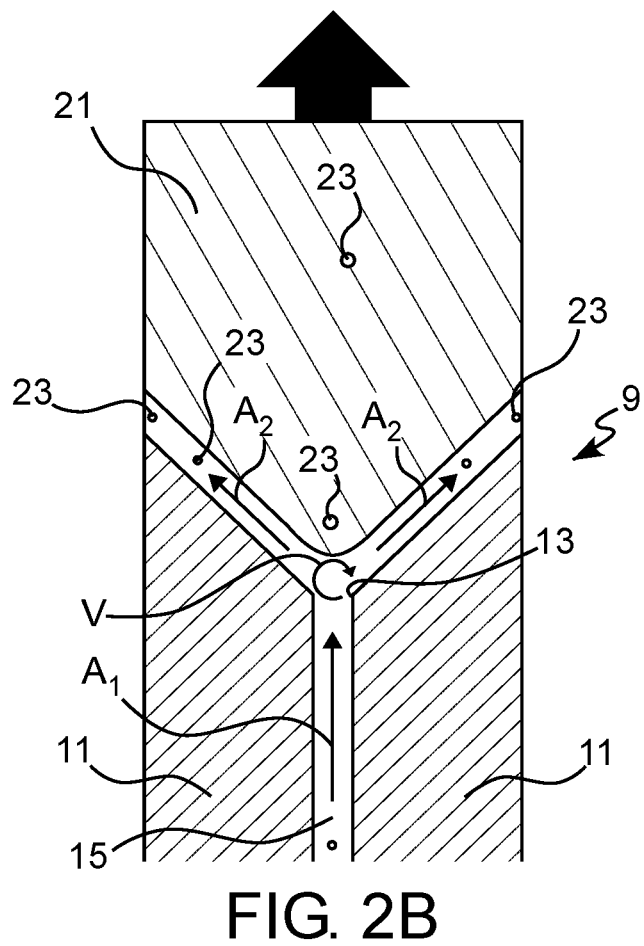
FIG. 2B is a portion of the schematic cross-sectional view of FIG. 2A enlarged for magnification purposes.

In general, the die material is selected such that it is chemically inert with respect to the liquid melt, but is wetted by the liquid melt. Wetting is indicated by the formation of a meniscus of liquid melt at the top of die. The size (i.e., height) and shape of the meniscus is determined by the surface tension between the molten material and the solid comprising the die, as well as the density of the liquid melt and gravity. The growth interface, where the crystal is formed, is at the top surface of the die. Liquid melt is delivered to the top surface of the die by capillary flow of liquid rising through the capillaries 15 in the die 9. With reference to FIGS. 2A and 2B, a typical die 9 includes two adjacent rectangular die plates 11 extending in and out of the plane of the drawing. The die plates 11 are typically separated by spacers (not shown) so that the die plates 11 are only separated by a small distance, typically from 0.05 cm to 0.3 cm, which corresponds to the width of the capillary 15. The die opening 13 is defined as the distance from the outer edge of one die plate 11 to the outer edge of the other, and determines the thickness of the crystal. The arrangements of the die plates 11 result in capillaries 15 through which the melt flows from the crucible 5 to the die opening 13 as denoted by arrows $A_1$. The melt then flows to the die opening 13 to form a thin wetting layer of melted material having boundaries at the outer edges of the die plates 11 as denoted by arrows $A_2$. The crystal growth occurs at the solid/liquid interface at the upper surface of the thin wetting layer of melted material, with the resulting crystal 21 having a thickness spanning the die opening 13 (as defined above). After a spreading process from the initial seed crystal, the final width of the crystal is determined by the length of the die (in and out of the plane of the drawing). The height is determined by how long and how fast the crystal pulling process proceeds.

In order to form a crystal using the EFG technique, a seed crystal 19, cut from a previously grown crystal, is brought into contact with the top of the die 9. Due to the high thermal gradient at the die, portions of the seed crystal 19 melt on contact with the die, and the thin liquid layer eventually merges with the capillary liquid. As the seed is pushed further down, eventually the solid bottom edge of the seed becomes conformal with the die surface. Once this intimate wetted contact is established and a full meniscus is present, the seed can be pulled up, away from the die 9 at a predetermined speed. As the seed crystal is withdrawn, the melt material crystallizes onto the seed crystal. While initial seed contact is made at only one point on the die (e.g. the center), with proper thermal management the meniscus spreads across the length of the die 9 (in and out of the plane of the drawing). The spreading is caused by the progressive lateral freezing of the meniscus at the edges of the crystal (not shown in cross-section). The meniscus spreads until it reaches the edge of the die 9. Various physical principles prevent the meniscus from going beyond the edge of the die. As long as the angle formed by the edges of the die 9 is 90° or less, the meniscus is constrained by the edge of the die 9. As the seed crystal is raised, the meniscus spreads across the surface of the die 9, and the crystal spreads as well (quickly in the left/right directions, slowly in/out of plane). Temperature adjustments to the crucible 5, to the cavity into which the seed is pulled, and/or adjustments to the seed lift rate are made as required to promote the spread of the crystal across the surface of the die 9 and to control its growth rate. When the crystal reaches the shape defined by the edges of the die 9 in both dimensions, its final form is set by the edges of the die 9.

At that point, a steady state equilibrium is established, and, as long as liquid continues to be delivered to the surface of the die 9 by capillary action from the melt 7, a crystal of constant cross-section defined by the top surface of the die 9 is grown. The heaters used to maintain the crucible 5 and the inside of the chamber 3 at the appropriate temperature are chosen by factors such as the size of the crucible/crystal, the geometry of the crucible (round, rectangular), and the power requirements. In some instances, induction heating may be employed. Other systems utilize resistance heating elements. A hybrid approach may also be utilized in which induction coils are used to heat a susceptor (usually graphite in the case of sapphire growth), whereby the susceptor then acts like a resistance heating element that radiates heat to the crucible.

In addition, the apparatus may also include an afterheater (not shown). The afterheater sits above the crucible 5 and provides an environment in which the crystal's temperature drops gradually from the freezing point to some intermediate value below the freezing point but significantly above room temperature, such as around 1800° C. in the case of sapphire crystal growth. Then, once growth is completed and the crystal has been separated from the die, it can be cooled down to room temperature in a controlled fashion. The afterheater can be either active or passive. A passive afterheater receives heat radiated or conducted from the hot zone containing the crucible 5. An active afterheater has its own heat source. This can be controlled separately from the main heat source heating the growth crucible 5 and thus be independent, or it can utilize the same power supply, in which case its time-temperature profile tracks that of the growth crucible 5 albeit at a lower value.

Generally, the flow of the liquid melt 7 in a die as shown in FIG. 2A promotes the aggregation of undesirable elements, such as bubbles and impurities 23, towards the outer surfaces of the grown crystals due to the sloped edges of the die plates 11 at the die opening 13. This is desirable since the outer surface of a grown crystal typically needs to be ground and polished to produce a finished window. However, as shown in FIG. 2B, the above described "normal" flow of the liquid melt may be disrupted in certain instances. For example, one side of the liquid growth interface may collapse due to the temperature at the die opening 13 being too cold, thereby causing a jog in the panel. In another example, as shown in FIG. 2B, the temperature at the die opening 13 may be too high, thereby creating an overly large meniscus allowing vortex conditions as denoted by arrow V. When such vortex conditions exist, bubbles and impurities 23 become incorporated into in the center of the panel. This is undesirable because there is no process to easily remove such bubbles and impurities from the final product. Although bubbles and impurities 23 can be found to incorporate anywhere in the thickness of a crystal, the most common depths are as follows in order of prevalence: 1) at the surface; 2) <30 microns in from a surface; 3) at the center; and 4) random other positions With the above background in mind and with reference to FIG. 3A, a system for producing thick crystal panels comprises a die 50 having: a first outer die plate 52 having a generally rectangular shape; a second outer die 54 plate having a generally rectangular shape; and a central die plate 56 positioned between the first outer die plate 52 and the second outer die plate 54 such that two capillaries 58a, 58b are formed between the first outer die plate 52 and the second outer die plate 54. A first end 60 of the first outer die plate 52 and a first end 62 of the second outer die plate 54 each have a slope 64, 66 extending away from the two capillaries 58a, 58b to form a growth interface 68 at a top of the die 50. Second ends 70 of the first outer die plate 52 and the second outer die plate 54 are immersed in a raw material melt 7 provided in a crucible 5 (see FIG. 5). In one example, each of slopes 64, 66 extend away from the two capillaries at an angle between the slopes 64, 66 and a vertical axis of 90 degrees (flat) down to 20 degrees. In one example the angle is in the range of 75 degrees to 45 degrees in order to promote the movement of bubbles and other impurities to the end of the meniscus. The raw material melt 7 is configured to travel to the growth interface 68 by capillary flow of the raw material melt 7 through the two capillaries 58a, 58b as denoted by arrows $A_1$.

Figure 3A:
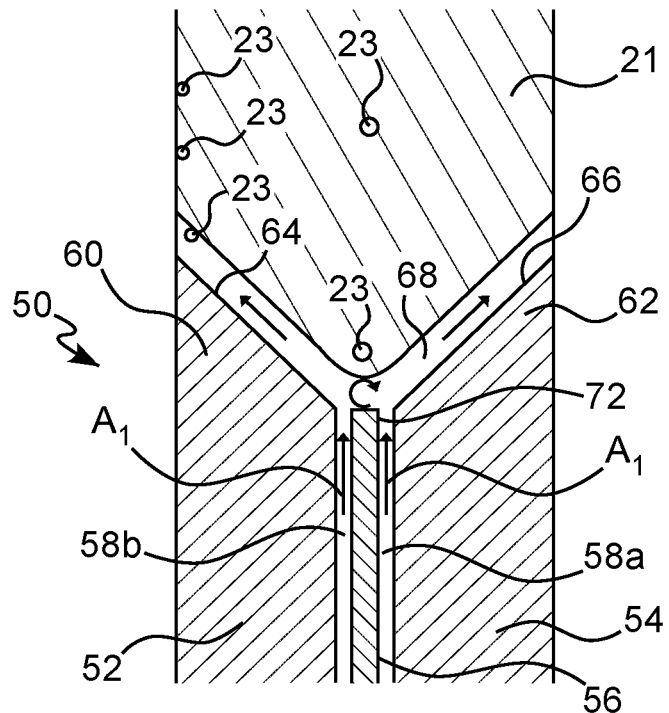
FIG. 3A is a schematic cross-sectional view of a die in accordance with one example of the present disclosure.

While the configuration shown in FIG. 3A allows for production of thicker panels because more raw material melt 7 is provided to the growth interface 68, it can lead to vortex conditions similar to those described with regard to FIG. 2B caused at the point where the two capillaries 58a, 58b meet. Problems arise when the flows create "dead spots" where the normal laminar flow of material is interrupted and an eddy 72 can form. These eddies 72, or recirculation points, allow not only the stable presence of bubbles 23 next to a central part of the crystal, but also the potential to merge smaller bubbles into larger ones.

Figure 3B:
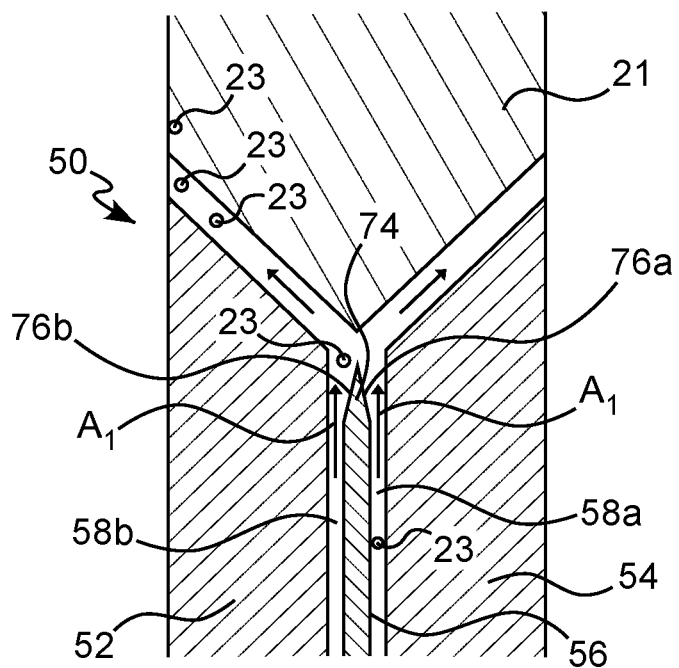
FIG. 3B is a schematic cross-sectional view of a die in accordance with another example of the present disclosure.

With reference to FIG. 3B, in order to overcome the problems of merging flows from multiple capillaries 58a, 58b, the central die plate 56 may be provided with a first end 74 having a pair of angled surfaces 76a, 76b meeting at a point to form a knife-edge. The angled surfaces 76a, 76b may be provided at an angle of 1 to 30 degrees, for example 5 to 15 degrees, relative to the longitudinal axis of the central die plate. The knife-edge, as shown in FIG. 3B, serves to direct and merge the competing flows in an orderly fashion, negating the competitive or buffeting effects leading to the creation of eddies 72 in FIG. 3A. In other words, the knife edge at the first end 74 of the central die plate 56 provides laminar flow at a point where the two capillaries 58a, 58b merge at the growth interface. In addition, the knife edge may have a radius of curvature of less than 50 microns in order to avoid eddies. For example, an angle of the knife edge may approach zero, within the limits of the ability to fabricate such delicate edge features over a long distance (20+ cm).

Figure 5:
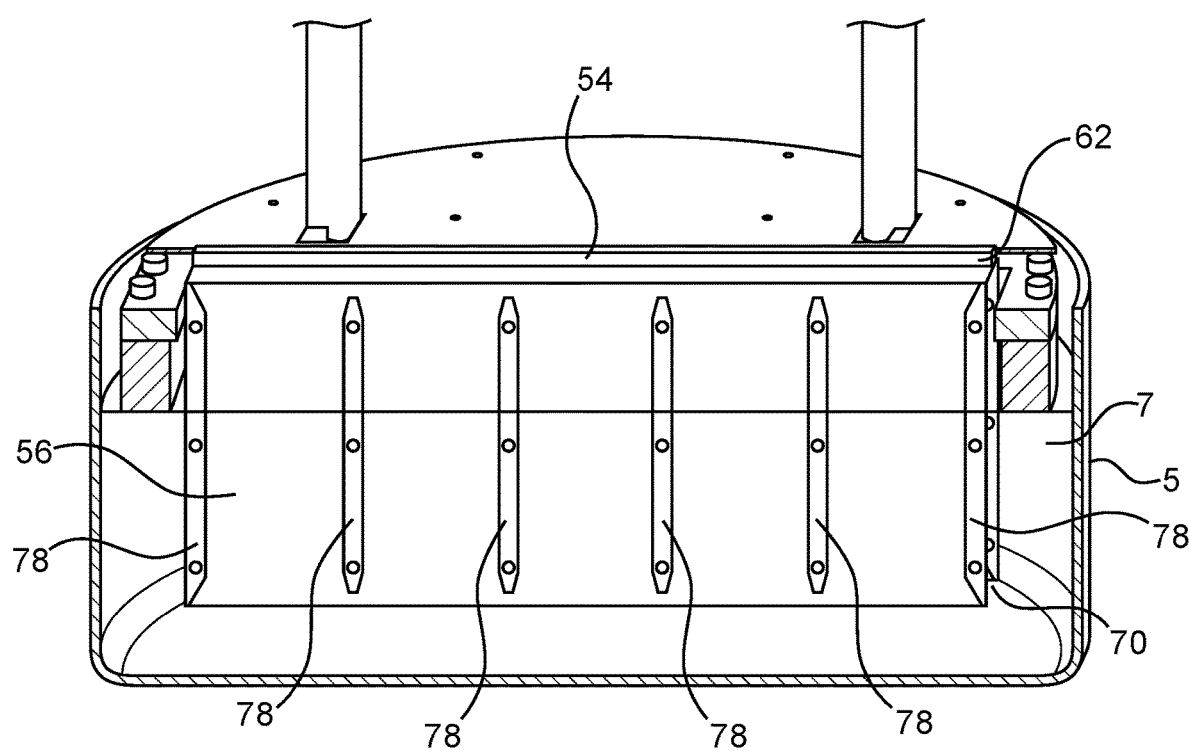
FIG. 5 is a perspective cross-sectional view of a system for growing crystal sheets in accordance with the present disclosure.

With reference to FIG. 5, a plurality of spacers 78 are provided between the first outer die plate 52 and the central die plate 56 and between the second outer die plate 54 and the central die plate 56. The spacers 78 extend most of the height of the die 50 but terminate prior to the die opening. The entire stack (first outer die plate 52, central die plate 56, second outer die plate 54, and spacers 78) is held together by bolts penetrating from the left side of FIGS. 3A and 3B to the right and nutted on both sides to maintain the tight gap tolerances.

Figure 4A:
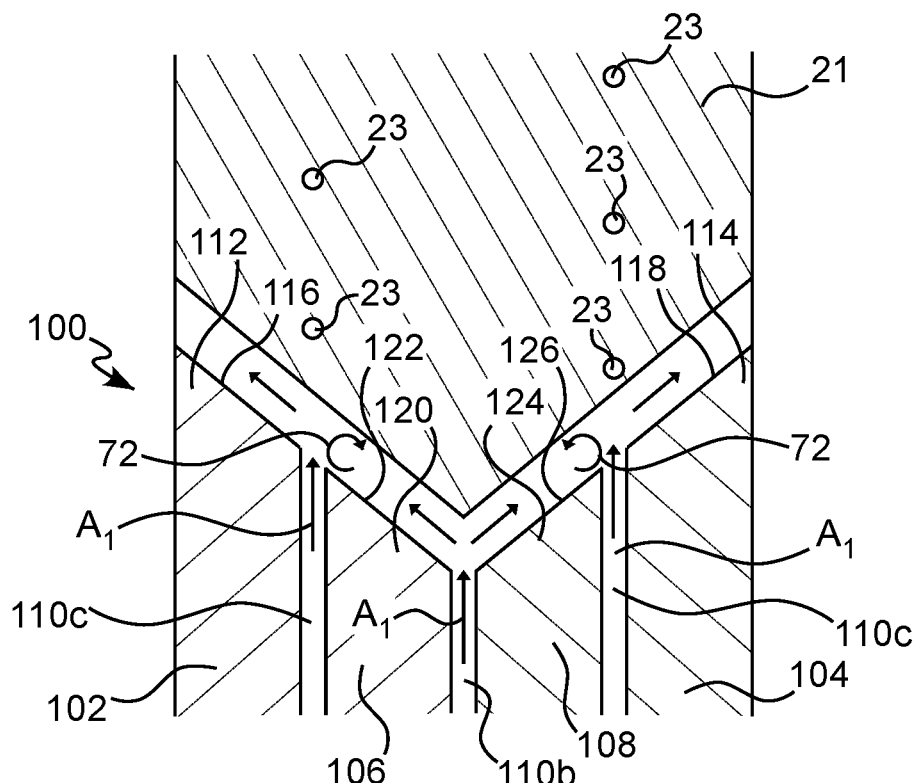
FIG. 4A is a schematic cross-sectional view of a die in accordance with still another example of the present disclosure.

With reference to FIG. 4A, another example of a die 100 for growing thick crystal panels. The die of FIG. 4A is configured to create an even thicker panel as it is provided with three capillaries and can thereby deliver more raw material melt to the growth interface. The die 100 comprises: a first outer die plate 102 having a generally rectangular shape; a second outer die plate 104 having a generally rectangular shape; a first central die plate 106 positioned between the first outer die plate 102 and the second outer die plate 104; and a second central die plate 108 positioned between the first outer die plate 102 and the second outer die plate 104. The die plates are arranged such that: a first capillary 110a is formed between the first outer die plate 102 and the first central die plate 106; a second capillary 110b is formed between the first central die plate 106 and the second central die plate 108; and a third capillary 110c is formed between the second central die plate 108 and the second outer die plate 104.

A first end 112 of the first outer die plate 102 and a first end 114 of the second outer die plate 104 each have a slope 116, 118 extending away from capillaries 110a, 110c. In addition, a first end 120 of the first central die plate 106 has a slope 122 that matches the slope 116 of the first end 112 of the first outer die plate 102 and a first end 124 of the second central die plate 108 has a slope 126 that matches the slope 118 of the first end 114 of the second outer die plate 104. Second ends of the first outer die plate 102 and the second outer die plate 104 are immersed in a raw material melt 7 provided in a crucible 5. The raw material melt 7 is configured to travel to the growth interface by capillary flow of the raw material melt 7 through the three capillaries 110a, 110b, 110c as denoted by arrows $A_1$.

While the configuration shown in FIG. 4A allows for production of thicker panels because more raw material melt 7 is provided to the growth interface, it can lead to vortex conditions similar to those described with regard to FIGS. 2B and 3A caused at the points where the capillaries 110a, 110b, 110c meet. As discussed above, problems arise when the flows create "dead spots" where the normal laminar flow of material is interrupted and an eddy 72 can form. These eddies 72, or recirculation points, allow not only the stable presence of bubbles 23 next to a central part of the crystal, but also the potential to merge smaller bubbles into larger ones.

Figure 4B:
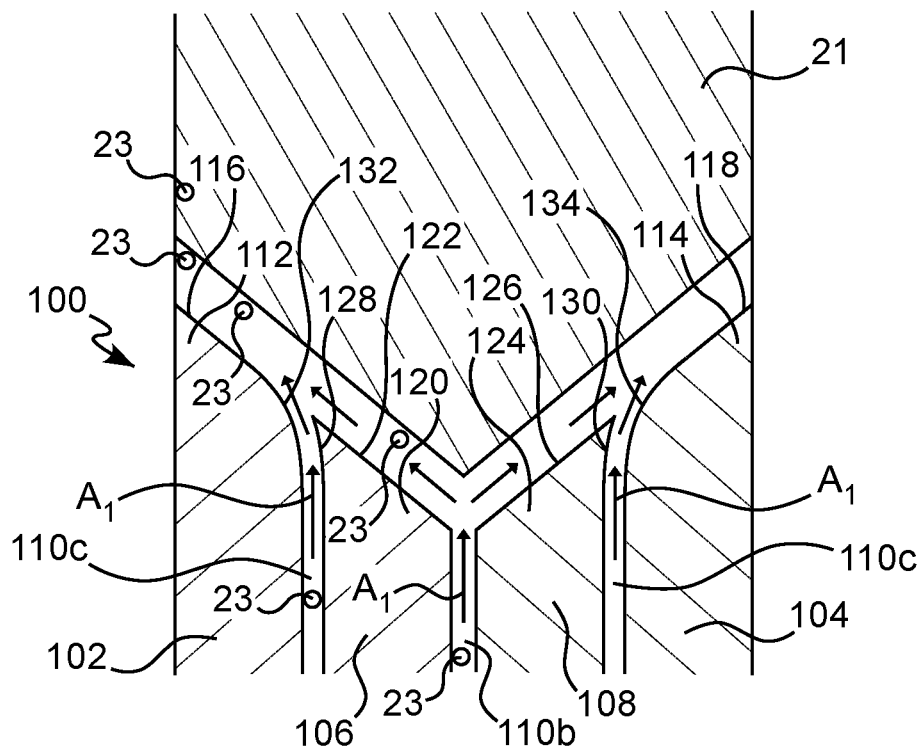
FIG. 4B is a schematic cross-sectional view of a die in accordance with another example of the present disclosure.

With reference to FIG. 4B, in order to overcome the problems of merging flows from multiple capillaries 110a, 110b, 110c, the first end 120 of the first central die plate 106 comprises an angled knife edge 128 configured to direct and merge the raw material melt from capillaries 110a and 110b at the growth interface and the first end 124 of the second central die plate 108 comprises an angled knife edge 130 configured to direct and merge the raw material melt from capillaries 110b and 110c at the growth interface. These angled knife edges provide laminar flow at a point where the capillaries 110a, 110b, 110c merge at the growth interface. In addition, the first ends 112, 114 of the first outer die plate 102 and the second outer die plate 104 each comprise a chamfered surface 132, 134 prior to the slope 116, 118. The chamfered surfaces 132, 134 further help with the smooth merging of the liquid flows. Finally, a plurality of spacers (not shown) are provided between the first outer die plate 102 and the first central die plate 106, between the first central die plate 106 and the second central die plate 108, and between the second outer die plate 104 and the second central die plate 108, similarly as shown in FIG. 5.

While examples of a die with two capillaries and three capillaries have been discussed hereinabove, this is not to be construed as limiting the present disclosure as any suitable number of capillaries may be provided in the die to achieve the desired final panel thickness.

While specific embodiments of the device of the present disclosure have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the device of the present disclosure which is to be given the full breadth of the claims appended and any and all equivalents thereof.

The invention claimed is:

1. A die for growing a single crystal by an Edge-defined Film-fed Growth (EFG) technique, the die comprising:
   a first outer die plate having a generally rectangular shape;
   a second outer die plate having a generally rectangular shape; and
   at least one central die plate positioned between the first outer die plate and the second outer die plate such that at least two capillaries are formed between the first outer die plate and the second outer die plate,
   wherein first ends of the first outer die plate and the second outer die plate have a slope extending away from at least one of the at least two capillaries to form a growth interface at a top of the die,
   second ends of the first outer die plate and the second outer die plate are immersed in a raw material melt provided in a crucible,
   the raw material melt is configured to travel to the growth interface by capillary flow of the raw material melt through the at least two capillaries, and
   the at least one central die plate has a first end having a pair of angled surfaces meeting at a point.

2. The die of claim 1, wherein the pair of angled surfaces meeting at a point forms a knife edge.

3. The die of claim 2, wherein the knife edge has a radius of curvature of less than 50 microns.

4. The die of claim 2, wherein the knife edge is configured to provide laminar flow at a point where the at least two capillaries merge at the growth interface.

5. The die of claim 2, wherein the angled surfaces are provided at an angle of 1 to 30 degrees relative to the longitudinal axis of the central die plate.

6. A die for growing a single crystal by an Edge-defined Film-fed Growth (EFG) technique, the die comprising:
   a first outer die plate having a generally rectangular shape;
   a second outer die plate having a generally rectangular shape; and
   at least one central die plate positioned between the first outer die plate and the second outer die plate such that at least two capillaries are formed between the first outer die plate and the second outer die plate,
   wherein first ends of the first outer die plate and the second outer die plate have a slope extending away from at least one of the at least two capillaries to form a growth interface at a top of the die,
   second ends of the first outer die plate and the second outer die plate are immersed in a raw material melt provided in a crucible,
   the raw material melt is configured to travel to the growth interface by capillary flow of the raw material melt through the at least two capillaries, and
   a plurality of spacers are provided between the first outer die plate and the at least one central die plate and between the second outer die plate and the at least one central die plate.

7. A die for growing a single crystal by an Edge-defined Film-fed Growth (EFG) technique, the die comprising:
   a first outer die plate having a generally rectangular shape;
   a second outer die plate having a generally rectangular shape; and
   at least one central die plate positioned between the first outer die plate and the second outer die plate such that at least two capillaries are formed between the first outer die plate and the second outer die plate,
   wherein first ends of the first outer die plate and the second outer die plate have a slope extending away from at least one of the at least two capillaries to form a growth interface at a top of the die,
   second ends of the first outer die plate and the second outer die plate are immersed in a raw material melt provided in a crucible,
   the raw material melt is configured to travel to the growth interface by capillary flow of the raw material melt through the at least two capillaries, and
   the at least one central die plate comprises a first central die plate and a second central die plate.

8. The die of claim 7, wherein a first end of the first central die plate has a slope that matches the slope of the first end of the first outer die plate and a first end of the second central die plate has a slope that matches the slope of the first end of the second outer die plate.

9. The die of claim 8, wherein the first end of the first central plate comprises an angled knife edge configured to direct and merge the raw material melt from at least two of the capillaries at the growth interface and the first end of the second central plate comprises an angled knife edge configured to direct and merge the raw material melt from at least two of the capillaries at the growth interface.

10. The die of claim 9, wherein the first ends of the first outer die plate and the second outer die plate each comprise a chamfered surface prior to the slope.

11. The die of claim 7, wherein a plurality of spacers are provided between the first outer die plate and the first central die plate, between the first central die plate and the second central die plate, and between the second outer die plate and the second central die plate.

12. An apparatus for growing a crystal, the apparatus comprising:
   a crucible configured to contain a liquid melt; and
   a die located above the growth crucible, the die comprising: a first outer die plate having a generally rectangular shape; a second outer die plate having a generally rectangular shape; and at least one central die plate positioned between the first outer die plate and the second outer die plate such that at least two capillaries are formed between the first outer die plate and the second outer die plate, wherein first ends of the first outer die plate and the second outer die plate have a slope extending away from at least one of the at least two capillaries to form a growth interface at a top of the die, second ends of the first outer die plate and the second outer die plate are immersed in the liquid melt provided in the crucible, the liquid melt is configured to travel to the growth interface by capillary flow of the raw material melt through the at least two capillaries, and the at least one central die plate has a first end having a pair of angled surfaces meeting at a point.

13. The apparatus of claim 12, wherein the pair of angled surfaces meeting at a point forms a knife edge.

14. The apparatus of claim 13, wherein the knife edge has a radius of curvature of less than 50 microns.

15. The apparatus of claim 13, wherein the knife edge is configured to provide laminar flow at a point where the at least two capillaries merge at the growth interface.

16. The apparatus of claim 13, wherein the angled surfaces are provided at an angle of 1 to 30 degrees relative to the longitudinal axis of the central die plate.

17. The apparatus of claim 12, wherein a plurality of spacers are provided between the first outer die plate and the at least one central die plate and between the second outer die plate and the at least one central die plate.

18. The apparatus of claim 12, wherein the at least one central die plate comprises a first central die plate and a second central die plate.

19. The apparatus of claim 18, wherein a first end of the first central die plate has a slope that matches the slope of the first end of the first outer die plate and a first end of the second central die plate has a slope that matches the slope of the first end of the second outer die plate.

20. The apparatus of claim 19, wherein the first end of the first central plate comprises an angled knife edge configured to direct and merge the raw material melt from at least two of the capillaries at the growth interface and the first end of the second central plate comprises an angled knife edge configured to direct and merge the raw material melt from at least two of the capillaries at the growth interface.

21. The apparatus of claim 20, wherein the first ends of the first outer die plate and the second outer die plate each comprise a chamfered surface prior to the slope.

22. The apparatus of claim 18, wherein a plurality of spacers are provided between the first outer die plate and the first central die plate, between the first central die plate and the second central die plate, and between the second outer die plate and the second central die plate.

* * * * *